(12) United States Patent
Yamada et al.

(10) Patent No.: US 9,723,715 B2
(45) Date of Patent: Aug. 1, 2017

(54) ANISOTROPIC CONDUCTIVE FILM, CONNECTION METHOD, AND ASSEMBLY

(71) Applicant: DEXERIALS CORPORATION, Shinagawa-ku, Tokyo (JP)

(72) Inventors: Yasunobu Yamada, Kanuma (JP); Naoya Uesawa, Kanuma (JP); Kazuhisa Aoki, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 117 days.

(21) Appl. No.: 14/425,462

(22) PCT Filed: Sep. 10, 2013

(86) PCT No.: PCT/JP2013/074317
§ 371 (c)(1),
(2) Date: Mar. 3, 2015

(87) PCT Pub. No.: WO2014/045931
PCT Pub. Date: Mar. 27, 2014

(65) Prior Publication Data
US 2015/0237725 A1   Aug. 20, 2015

(30) Foreign Application Priority Data

Sep. 18, 2012  (JP) ................................ 2012-203978

(51) Int. Cl.

| | |
|---|---|
| *H05K 1/11* | (2006.01) |
| *H05K 1/09* | (2006.01) |
| *H05K 1/03* | (2006.01) |
| *C09J 9/02* | (2006.01) |
| *C08L 67/00* | (2006.01) |
| *C08L 75/04* | (2006.01) |
| *C08L 13/00* | (2006.01) |
| *H05K 3/32* | (2006.01) |
| *H05K 13/04* | (2006.01) |

(52) U.S. Cl.
CPC ................ *H05K 1/11* (2013.01); *C08L 13/00* (2013.01); *C08L 67/00* (2013.01); *C08L 75/04* (2013.01); *C09J 9/02* (2013.01); *H05K 1/0353* (2013.01); *H05K 1/09* (2013.01); *H05K 3/321* (2013.01); *H05K 13/0469* (2013.01); *C08L 2203/16* (2013.01); *C08L 2205/025* (2013.01); *C08L 2205/03* (2013.01); *C08L 2205/12* (2013.01); *H05K 2203/121* (2013.01); *Y10T 156/10* (2015.01)

(58) Field of Classification Search
CPC .......... H05K 1/11; H05K 1/09; H05K 1/0353; H05K 13/0469; H05K 3/321; H05K 2203/121; C08L 67/00; C08L 13/00; C08L 75/04; C08L 2205/025; C08L 2205/12; C08L 2205/03; C08L 2203/16; C09J 9/02; Y10T 156/10
See application file for complete search history.

(56) References Cited

U.S. PATENT DOCUMENTS

| | | | |
|---|---|---|---|
| 6,833,180 B1 | 12/2004 | Kodemura | |
| 2010/0013078 A1 | 1/2010 | Nagai | |
| 2010/0148130 A1* | 6/2010 | Namkung | ........... C08F 283/008 252/513 |
| 2011/0031449 A1 | 2/2011 | Enomoto et al. | |
| 2012/0228559 A1 | 9/2012 | Enomoto et al. | |

FOREIGN PATENT DOCUMENTS

| | | |
|---|---|---|
| CN | 101578698 A | 11/2009 |
| CN | 101802118 A | 8/2010 |
| JP | 2005-190933 A | 7/2005 |
| JP | 2011-132304 A | 7/2011 |
| JP | 2013007048 * | 1/2013 |
| TW | 201125661 A | 8/2011 |
| WO | WO 99/01519 A1 | 1/1999 |
| WO | WO 2009/038190 A1 | 3/2009 |

OTHER PUBLICATIONS

International Search Report (PCT/ISA/210) mailed on Nov. 19, 2013, by the Japanese Patent Office as the International Searching Authority for International Application No. PCT/JP2013/074317.
Written Opinion (PCT/ISA/237) mailed on Nov. 19, 2013, by the Japanese Patent Office as the International Searching Authority for International Application No. PCT/JP2013/074317.
International Preliminary Report on Patentability (PCT/IPEA/409) mailed on Aug. 22, 2014, by the Japanese Patent Office as the International Examining Authority for International Application No. PCT/JP2013/074317.
Office Action issued Feb. 17, 2017, by the Taiwanese Patent Office in corresponding Taiwanese Patent Application No. 102133226 and an English translation of the Office Action (10 pages).

* cited by examiner

*Primary Examiner* — Robert Jones, Jr.
(74) *Attorney, Agent, or Firm* — Buchanan, Ingersoll & Rooney PC (57) ABSTRACT

An anisotropic conductive film, which contains a crystalline resin, an amorphous resin, and conductive particles, wherein the anisotropic conductive film is an anisotropic conductive film configured to anisotropic conductively connect a terminal of a first electronic part and a terminal of a second electronic part, and wherein the crystalline resin contains a crystalline resin containing a bond characterizing a resin, which is identical to a bond characterizing a resin contained in the amorphous resin.

19 Claims, 2 Drawing Sheets

ANISOTROPIC CONDUCTIVE FILM, CONNECTION METHOD, AND ASSEMBLY

TECHNICAL FIELD

The present invention relates to an anisotropic conductive film, a connecting method, and a bonded structure.

BACKGROUND ART

As for the means for connecting electronic parts to each other, connecting materials, such as an anisotropic conductive film (ACF), an anisotropic conductive paste (ACP), have been conventionally used.

The anisotropic conductive film is a film-shaped connecting material, which is formed, for example, by dispersing conductive particles in an insulating binder containing a thermoset resin. The binder containing the thermoset resin is thermally cured by thermocompression bonding the parts of electrodes of the electronic parts, which are to be anisotropic conductively connected together, via the ACF, to thereby connect the electronic parts.

For example, the anisotropic conductive paste contains an insulating binder, conductive particles, and a solvent (see, for example, PTL 1 and PTL 2). A method for using the ACP containing the solvent is, for example, as follows. As the ACP is printed on an electronic part, such as a flexible printed circuit (FPC), and heated to dry, a coating film formed of the ACP is formed on an area of an electrode of the electronic part. The FPC, to which the coating film formed of the ACP has been formed, is often transported in this state at room temperature. As for the ACP, therefore, also used is a type thereof where a non-reactable binder that is not cured by heat is used.

As for connection between electronic parts, recently required has been connection at low temperature and low pressure within a short period. Connection at low temperature is desired because a thermal damage to electronic parts is reduced, variation in heating temperature (heating temperature at an area of an electrode changes whether or not a part, which is provided at a position extended from a wire, is linked with the wire connected to the area of the electrode, which causes variation in temperature, and the variation becomes particularly significant as a packaging density increases) at the time of connection is prevented, and load to packaging equipment is reduced. Connection at low pressure is desired because damage applied to a thin substrate or a touch panel is reduced. Connection with a short period is desired in view of productivity.

However, the conventional anisotropic conductive film uses a thermoset resin, and hence curing is cause during storage, as the anisotropic conductive film is designed to correspond to connection at low temperature within a short period. Therefore, it is necessary to make a storage period short, and such anisotropic conductive film is not suitable for practical use.

Moreover, the conventional anisotropic conductive paste needs to reduce a viscosity of the ACP for use, when it is designed to correspond to connection at low pressure. When the viscosity of the ACP is reduced, the binder in the ACP can not bear the restoring force of the electronic parts caused just after the termination of the thermal pressure bonding. As a result, the deformation of the conductive particles cannot be maintained, which causes insufficient connection resistance.

Accordingly, it is currently desired to provide an anisotropic conductive film, which can realize connection at low temperature and low pressure within a short period while maintaining sufficient connection resistance, as well as a connecting method using the anisotropic conductive film, and a bonded structure using the anisotropic conductive film.

CITATION LIST

Patent Literature

PTL 1: Japanese Patent Application Laid-Open (JP-A) No. 2011-132304
PTL 2: International Publication No. WO99/01519

SUMMARY OF INVENTION

Technical Problem

The present invention aims to solve the aforementioned various problems in the art, and achieve the following object. Specifically, an object of the present invention is to provide an anisotropic conductive film, which can realize connection at low temperature and low pressure within a short period, while maintaining sufficient connection resistance, as well as providing a connecting method using the anisotropic conductive film, and a bonded structure using the anisotropic conductive film.

Solution to Problem

The means for solving the aforementioned problems as follows:
<1> An anisotropic conductive film, containing:
  a crystalline resin;
  an amorphous resin; and
  conductive particles,
  wherein the anisotropic conductive film is an anisotropic conductive film configured to anisotropic conductively connect a terminal of a first electronic part and a terminal of a second electronic part, and
  wherein the crystalline resin contains a crystalline resin containing a bond characterizing a resin, which is identical to a bond characterizing a resin contained in the amorphous resin.
<2> The anisotropic conductive film according to <1>, wherein the anisotropic conductive film satisfies the following formula:

$$\Delta T1 > \Delta T2$$

where $\Delta T1$ is an absolute value of a difference between melting onset temperature and endothermic peak temperature at the time of heating, and $\Delta T2$ is an absolute value of a difference between crystallization onset temperature and exothermic peak temperature at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.
<3> The anisotropic conductive film according to <1> or <2>, wherein a mass ratio (crystalline resin:amorphous resin) of the crystalline resin to the amorphous resin is 25:75 to 75:25.
<4> The anisotropic conductive film according to any one of <1> to <3>, wherein the crystalline resin contains a crystalline polyester resin, and the amorphous resin contains an amorphous polyester resin.

<5> The anisotropic conductive film according to any one of <1> to <4>, further containing an elastomer.

<6> The anisotropic conductive film according to <5>, wherein a mass ratio (X:Y) of a sum (X) of an amount of the crystalline resin and an amount of the amorphous resin to an amount (Y) of the elastomer is 160:40 to 60:140.

<7> The anisotropic conductive film according to any one of <1> to <6>, wherein the conductive particles have an average particle diameter of 2 μm to 40 μm.

<8> The anisotropic conductive film according to any one of <1> to <7>, wherein the anisotropic conductive film satisfies a relationship that a difference (P1−P2) is 11.0° C. or greater, where P1 is the endothermic peak temperature at the time of heating, and P2 is the exothermic peak temperature at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

<9> The anisotropic conductive film according to any one of <1> to <8>, wherein the anisotropic conductive film gives an endothermic value of 1.0 J/g to 12 J/g at the time of heating, and an exothermic value of 1.0 J/g to 6.0 J/g at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

<10> A connecting method, containing:
arranging the anisotropic conductive film according to any one of <1> to <9> on a terminal of a second electronic part;
arranging a first electronic part on the anisotropic conductive film in a manner that a terminal of the first electronic part is in contact with the anisotropic conductive film; and
heating and pressing the first electronic part with a heat-press member, to thereby anisotropic conductively connect the terminal of the first electronic part to the terminal of the second electronic part.

<11> A bonded structure, containing:
a first electronic part containing a terminal;
a second electronic part containing a terminal; and
an anisotropic conductive film, which is present between the first electronic part and the second electronic part, and is configured to electrically connect the terminal of the first electronic part and the terminal of the second electronic part,
wherein the anisotropic conductive film is the anisotropic conductive film according to any one of <1> to <9>.

Advantageous Effects of the Invention

The present invention can solve the aforementioned various problems in the art, achieve the aforementioned object, and provide an anisotropic conductive film, which can realize connection at low temperature and low pressure within a short period, while maintaining sufficient connection resistance, as well as providing a connecting method using the anisotropic conductive film, and a bonded structure using the anisotropic conductive film.

DESCRIPTION OF EMBODIMENTS (Anisotropic Conductive Film)
The anisotropic conductive film of the present invention contains at least a crystalline resin, an amorphous resin, and conductive particles, preferably further contains an elastomer, and may further contain other components, as necessary.

The anisotropic conductive film is an anisotropic conductive film, which is configured to anisotropic conductively connect a terminal of a first electronic part to a terminal of a second electronic part.

<Crystalline Resin and Amorphous Resin>
The crystalline resin is appropriately selected depending on the intended purpose without any limitation, provided that it contains a crystalline resin containing a bond characterizing a resin, which is identical to a bond characterizing a resin contained in the amorphous resin (which may be referred as "the same type of a crystalline resin to that of the amorphous resin" hereinafter).

In the case where the crystalline resin does not contain the same type of a crystalline resin to that of the amorphous resin, a smooth anisotropic conductive film cannot be obtained. As a result, connection resistance of the resulting anisotropic conductive film is insufficient.

As the crystalline resin contains the same type of a crystalline resin to that of the amorphous resin, on the other hand, the crystalline resin and the amorphous resin are mixed to create a state where the crystalline resin is easily dissolved in a solvent. Therefore, an anisotropic conductive film, in which the crystalline resin is evenly contained, can be obtained.

Moreover, the obtained anisotropic conductive film realizes connection at low temperature and low pressure within a short period. It is assumed that this is because solidification due to the crystalline resin occurs promptly, when the anisotropic conductive film returns from the heated state to room temperature after the obtained anisotropic conductive film is heated and softened.

Here, the bond characterizing a resin means a bond formed when the resin is synthesized through polymerization. For example, as for a polyester resin, the bond characterizing a resin means an ester bond formed when the resin is synthesized through polymerization. As for a polyurethane resin, the bond characterizing a resin means a urethane bond formed when the resin is synthesized through polymerization. As for a polyolefin resin, the bond characterizing a resin means a C—C bond formed when the resin is synthesized through polymerization. In another words, the bond characterizing a resin is a main bond of a resin.

Therefore, examples of a combination of the amorphous resin, and the crystalline resin containing the identical bond characterizing a resin to that the bond characterizing a resin contained in the amorphous resin include a combination of an amorphous polyester resin and a crystalline polyester resin, a combination of an amorphous polyolefin resin and a crystalline polyolefin resin, and a combination of an amorphous urethane resin and a crystalline urethane resin.

The crystalline resin may further contain a crystalline resin, other than a crystalline resin containing a bond characterizing a resin, which is identical to a bond characterizing a resin contained in amorphous resin.

Examples of a combination of the amorphous resin and the crystalline resin include a combination of an amorphous polyester resin, and a crystalline resin containing a crystalline polyester resin and a crystalline polyolefin resin.

In the present specification, the crystalline resin is determined as a resin having a crystalline region. Whether or not a resin is a crystalline resin can be confirmed, for example, by observing an endothermic peak for heating in differential scanning calorimetry.

The crystalline resin may be a mixture of resins containing crystalline regions.

A mass ratio (crystalline resin:amorphous resin) of the crystalline resin to the amorphous resin is appropriately selected depending on the intended purpose without any limitation, but the mass ratio thereof is preferably 15:85 to 85:15, more preferably 25:75 to 75:25.

<Conductive Particles>

The conductive particles are appropriately selected depending on the intended purpose without any limitation, and examples thereof include metal particles, and metal-coated resin particles.

The metal particles are appropriately selected depending on the intended purpose without any limitation, and examples thereof include nickel, cobalt, silver, copper, gold, palladium, and solder. These may be used alone, or in combination.

Among them, preferred are nickel, silver, and copper. Surfaces of these metal particles may be coated with gold or palladium for the purpose of preventing surface oxidization. Moreover, metal particles, to each surface of which metal protrusions or an insulating coating film formed of an organic material may be provided, may be used.

The metal-coated resin particles are appropriately selected depending on the intended purpose without any limitation, provided that they are particles, in each of which a surface of a resin particle is covered with a metal. Examples thereof include particles, in each of which a surface of a resin particle is covered with at least one metal selected from the group consisting of nickel, silver, solder, copper, gold, and palladium. Moreover, metal-coated resin particles, to each surface of which metal protrusions or an insulating coating film formed of an organic material may be provided, may be used. In case of connection considering low resistance, use of particles, in each of which a surface of a resin particle is covered with silver, is preferable.

A method for covering the resin particles with metal is appropriately selected depending on the intended purpose without any limitation, and examples thereof include electroless plating, and sputtering.

A material of the resin particles is appropriately selected depending on the intended purpose without any limitation, and examples thereof include a styrene-divinylbenzene copolymer, a benzoguanamine resin, a crosslinked polystyrene resin, an acrylic resin, and a styrene-silica composite resin.

The conductive particles are not particularly limited as long as they have conductivity when anisotropic conductive connection is realized. For example, particles, in each of which an insulating coating film is provided on a metal particle, are the aforementioned conductive particles, as long as the particles are deformed to expose the metal particles at the time when anisotropic conductive connection is made.

The average particle diameter of the conductive particles is appropriately selected depending on the intended purpose without any limitation, but the average particle diameter thereof is preferably 2 µm to 40 µm, more preferably 5 µm to 30 µm, even more preferably 10 µm to 25 µm, and particularly preferably 10 µm to 20 µm.

The average particle diameter is an average value of particle diameters measured on arbitrarily selected 10 conductive particles.

The particle diameters can be measured, for example, by observing under a scanning electron microscope.

An amount of the conductive particles is appropriately selected depending on the intended purpose without any limitation.

<Elastomer>

The elastomer is appropriately selected depending on the intended purpose without any limitation, and examples thereof include a polyurethane resin (polyurethane-based elastomer), acrylic rubber, silicone rubber, and butadiene rubber.

The elastomer is different from the crystalline resin and the amorphous resin in that the elastomer has rubber-like elasticity.

A mass ratio of a sum (X) of an amount of the crystalline resin and an amount of the amorphous resin to an amount (Y) of the elastomer is appropriately selected depending on the intended purpose without any limitation, but the mass ratio thereof is preferably 160:40 to 60:140.

An amount of the elastomer is appropriately selected depending on the intended purpose without any limitation.

<First Electronic Part and Second Electronic Part>

The first electronic part and the second electronic part are appropriately selected depending on the intended purpose without any limitation, provided that they are electronic parts each having a terminal, which are to be targets for anisotropic conductive connection using the anisotropic conductive film. Examples of the first electronic part and the second electronic parts include a glass substrate, a flexible substrate, a rigid substrate, an integrated circuit (IC) chip, tape automated bonding (TAB), and a liquid crystal panel. Examples of the glass substrate include an Al wire formed glass substrate, and an ITO wire formed glass substrate. Examples of the IC chip include an IC chip for controlling liquid crystal screen in a flat panel display (FPD).

The anisotropic conductive film preferably satisfies the following formula: $\Delta T1 > \Delta T2$, where $\Delta T1$ is an absolute value of a difference between melt onset temperature and endothermic peak temperature at the time of heating, and $\Delta T2$ is an absolute value of a difference between crystallization onset temperature and exothermic peak temperature at the time of cooling, as measured by differential scanning calorimetry under the following measuring conditions A (measuring temperature range, heating speed, and cooling speed).

[Measuring Conditions A]
Measuring temperature range: 30° C. to 250° C.
Heating speed: 10° C./min
Cooling speed: 20° C./min To satisfy the aforementioned formula $\Delta T1 > \Delta T2$ means that crystallization of the crystalline resin occurs promptly.

As the formula ΔT1>ΔT2 is satisfied, solidification of the anisotropic conductive film due to the crystalline resin occur promptly, when the anisotropic conductive film is returned from the heated state to room temperature after being heated and softened. As a result, connection at low temperature and low pressure within a short period is more certainly realized, and the anisotropic conductive film exhibiting excellent connection resistance at the time of connection is obtained.

The difference (ΔT1−ΔT2) between ΔT1 and ΔT2 is more preferably 15° C. or greater, particularly preferably 18° C. to 50° C.

The endothermic peak temperature (P1) as measured by differential scanning calorimetry under the measuring conditions A is appropriately selected depending on the intended purpose without any limitation, but it is preferably 70° C. to 115° C., more preferably 100° C. to 115° C., and particularly preferably 105° C. to 110° C.

The exothermic peak temperature (P2) as measured by differential scanning calorimetry under the measuring conditions A is appropriately selected depending on the intended purpose without any limitation, but it is preferably 60° C. to 105° C., more preferably 85° C. to 105° C., and particularly preferably 90° C. to 100° C.

As for the anisotropic conductive film, a difference (P1−P2) between the endothermic peak temperature (P1) at the time of heating and the exothermic peak temperature (P2) at the time of cooling as measured by differential scanning calorimetry under the measuring conditions A is preferably 11.0° C. or greater, more preferably 11.0° C. to 14.0° C.

As for the anisotropic conductive film, it is preferred that the endothermic value at the time of heating and the exothermic value at the time of cooling as measured by differential scanning calorimetry under the measuring conditions A be 1.0 J/g to 12 J/g, and 1.0 J/g to 6.0 J/g, respectively.

The fact that the endothermic phenomenon is observed at the time of heating means that a crystalline state of the crystalline resin component is broken down and the crystalline resin component is melted. When the endothermic value is 1.0 J/g to 12 J/g, the anisotropic conductive film becomes a melted state, with which the conductive particles are easily deformed, at the time of anisotropic conductive connection. When the endothermic value is less than 1.0 J/g, it is difficult to deform the conductive particles at the time of anisotropic conductive connection, and therefore a conduction failure may be caused. When the endothermic value is greater than 12 J/g, the viscosity change caused is large when the anisotropic conductive film is melted. Therefore, a large amount of air cells is included in the pressure bonded area of the anisotropic conductive film, which impairs the appearance of the connection. In some cases, connection reliability may be impaired by excess air cells.

The fact that an exothermic phenomenon is observed at the time of cooling means that the crystalline resin component in the melted state is rapidly solidified due to crystallization. Moreover, the exothermic value indicates a degree of solidification due to crystallization. When the exothermic value is less than 1.0 J/g, connection resistance increases after an environmental test, which may impair connection reliability. When the exothermic value is greater than 6.0 J/g, the anisotropic conductive film itself becomes too hard at room temperature. Therefore, usability, such as temporal bonding when the anisotropic conductive film is bonded, may be reduced, and peeling strength may become low.

The anisotropic conductive film does not contain a curing agent, and the resin therein does not crosslinked as heated. Therefore, the anisotropic conductive film, even use of which is connection at low temperature within a short period, can realize long term storage.

The average thickness of the anisotropic conductive film is appropriately selected depending on the intended purpose without any limitation, but the average thickness thereof is preferably 5 μm to 100 μm, more preferably 10 μm to 60 μm, and particularly preferably 20 μm to 50 μm.

A production method of the anisotropic conductive film is appropriately selected depending on the intended purpose without any limitation. Examples thereof include a method, which contains dissolving the crystalline resin and the amorphous resin in a solvent to obtain a varnish mixture, followed by optionally mixing the elastomer with the varnish mixture, further mixing the conductive particles with the resulting mixture to prepare an anisotropic conductive composition, and applying the anisotropic conductive composition onto a polyethylene terephthalate (PET) film, to which a releasing treatment has been performed.

The solvent is appropriately selected depending on the intended purpose without any limitation.

(Connecting Method)

The connecting method of the present invention contains at least a first arranging step, a second arranging step, and a heat-pressing step, and may further contain other steps, as necessary.

The connecting method is a method for anisotropic conductively connecting a terminal of a first electronic part and a terminal of a second electronic part.

The first electronic part and the second electronic part are appropriately selected depending on the intended purpose without any limitation, and examples thereof include those listed as the first electronic part and the second electronic part in the description of the anisotropic conductive film of the present invention.

<First Arranging Step>

The first arranging step is appropriately selected depending on the intended purpose without any limitation, provided that it is a step containing arranging the anisotropic conductive film of the present invention on a terminal of the second electronic part.

<Second Arranging Step>

The second arranging step is appropriately selected depending on the intended purpose without any limitation, provided that it is a step containing arranging the first electronic part on the anisotropic conductive film in a manner that a terminal of the first electronic part is in contact with the anisotropic conductive film.

<Heat-Press Step>

The heat-press step is appropriately selected depending on the intended purpose without any limitation, provided that it is a step containing heating and pressing the first electronic part with a heat-press member.

Examples of the heat-press member include a press member containing a heating system. Examples of the press member containing a heating system include a heat tool.

The temperature of the heating is appropriately selected depending on the intended purpose without any limitation, but the temperature thereof is preferably 100° C. to 140° C.

The pressure of the pressing is appropriately selected depending on the intended purpose without any limitation, but the pressure thereof is preferably 0.5 MPa to 10 MPa.

The duration of the heating and pressing is appropriately selected depending on the intended purpose without any limitation, but the duration thereof is preferably 0.5 seconds to 10 seconds.

(Bonded Structure)

The bonded structure of the present invention contains at least a first electronic part, a second electronic part, and an anisotropic conductive film, and may further contain other members, as necessary.

The first electronic part and the second electronic part are appropriately selected depending on the intended purpose without any limitation, and examples thereof include those listed as the first electronic part and the second electronic part in the description of the anisotropic conductive film of the present invention.

The anisotropic conductive film is the anisotropic conductive film of the present invention.

The anisotropic conductive film is present between the first electronic part and the second electronic part, and is configured to electrically connect a terminal of the first electronic part to a terminal of the second electronic part.

For example, the bonded structure can be produced by the connecting method of the present invention.

EXAMPLES

Examples of the present invention are explained hereinafter, but Examples shall not be construed as to limit the present invention in any way.

Example 1

<Production of Anisotropic Conductive Film>

A varnish mixture was obtained by mixing and stirring 25 parts by mass of a crystalline resin ARONMELT PES-111EE (manufactured by TOAGOSEI CO., LTD., a crystalline resin a main component of which was a crystalline polyester resin), 75 parts by mass of an amorphous resin ELITEL UE3500 (manufactured by UNITIKA LTD., an amorphous polyester resin), and 400 parts by mass of a mixed solvent (toluene:methyl ethyl ketone=1:1 (mass ratio)).

Subsequently, NIPPOLAN N-5196 (manufactured by Nippon Polyurethane Industry Co., Ltd., polyurethane-based elastomer of polycarbonate skeleton, solid content: 30% by mass) in an amount that was equivalent of 100 parts by mass on solid basis was mixed with the obtained varnish mixture.

To the resultant, thereafter, 7 parts by mass of spherical Ag-plated resin particles (conductive particles obtained in the following production method) having the average particle diameter of 20 μm was added, to thereby obtain an anisotropic conductive composition.

The obtained anisotropic conductive composition was applied on a 50 μm-thick polyethylene terephthalate (PET) film in a manner that the average thickness after being dried was to be 35 μm, followed by drying the applied anisotropic conductive composition at 80° C. for 10 minutes, to thereby produce an anisotropic conductive film.

—Production of Conductive Particles—
——Production of Divinylbenzene-based Resin Particles——

To a solution in which a blending ratio of divinylbenzene, styrene, and butyl methacrylate had been adjusted, benzoyl peroxide serving as a polymerization initiator was added, and the resulting mixture was heated with homogeneously stirring at high speed to carry out a polymerization reaction, to thereby obtain a particle dispersion liquid. The particle dispersion liquid was filtered, and dried under the reduced pressure to thereby obtain a block that was an aggregated body of particles. Moreover, the block was ground to thereby obtain divinylbenzene-based resin particles.

——Silver Plating of Resin Particles——

To a solution prepared by dissolving 4.25 g of silver nitrate serving as a silver salt in 625 mL of pure water at room temperature, 15 g of benzimidazole serving as a reducing agent was added. After confirming that the initially generated sediment was completely dissolved, 5 g of succinic acid imide 3 g of citric acid monohydrate were dissolved therein as complexing agents. Thereafter, 13 g of glyoxylic acid serving as a crystal-adjusting agent was added thereto and was completely dissolved, to thereby prepare an electroless silver plating solution.

Subsequently, the divinylbenzene-based resin particles obtained above were added to the electroless silver plating solution, and the resultant was heated with stirring and the temperature of the solution was maintained to 50° C. Thereafter, the particles therein were separated by filtration with Buchner funnel, and the separated particles were dried by means of a vacuum drier at 80° C. for 2 hours, to thereby obtain spherical Ag-plated resin particles (conductive particles) having the average particle diameter of 20 μm.

<Differential Scanning Calorimetry (DSC)>

A measurement of DSC was performed under the following conditions, to thereby determine melt onset temperature, endothermic peak temperature, and an endothermic value at the time of heating, as well as crystallization onset temperature, exothermic peak temperature, and an exothermic value at the time of cooling. The results are presented in Table 1-1.

Measuring Device: Q100, manufactured by TA Instruments Japan Inc.
Measuring Sample: 5 mg
Measuring Temperature Range: 30° C. to 250° C.
Heating Speed: 10° C./min
Cooling Speed: 20° C./min <Production of Bonded Structure and Evaluations of Bonded Structure>

A bonded structure was produced by the following method, and was subjected to the following evaluations. The results are presented in Table 1-1.

As for a second electronic part, a printed circuit board [0.4 mm-pitch (line/space=0.2/0.2), copper pattern thickness: 35 μm, nickel/gold plated, board thickness: 1.0 mm] was used.

As for a first electronic part, a flexible printed circuit board [0.4 mm-pitch (line/space=0.2/0.2), polyimide thickness: 25 μm, copper pattern thickness: 12 μm, nickel-gold plated] was used.

The anisotropic conductive film (film width: 2.0 mm) obtained above was arranged on a terminal of the second electronic part. Subsequently, the first electronic part was arranged on the anisotropic conductive film. Then, the first electronic part was heated and pressed via a buffer material (silicone rubber, thickness: 0.2 mm) by means of a heating tool (width: 2.0 mm) at 120° C., 2 MPa for 3 seconds, to thereby obtain a bonded structure.

<<Conduction Resistance Value (Connection Resistance)>>

The initial resistance and the resistance of the obtained bonded structure after a high temperature high humidity test (left in the environment of 60° C., 95% RH for 500 hours) were measured and evaluated in the following manner.

The resistance thereof was measured by means of a digital multimeter (product number: Digital Multimeter 34401A, manufactured by Agilent Technologies) with application of electric current of 1 mA, in accordance with a 4-terminal sensing method. The resistance was measured at 30 channels, and the maximum value of the resistance was evaluated based on the following evaluation criteria. The result is presented in 1-1.

[Evaluation Criteria]
 A: The resistance was less than 0.11Ω.
 B: The resistance was 0.11Ω or greater but less than 0.15Ω.
 C: The resistance was 0.15Ω or greater.

<<Peeling Strength>>

A 90° peeling test (JIS K6854-1), where the flexible printed circuit board was peeled from the printed circuit board in the direction of 90°, was performed. As for the peeling test, a test piece, which had been prepared by curing the bonded structure into a width of 1 cm, was used. The peeling strength was measured, and evaluated based on the following evaluation criteria. The result is presented in Table 1-1.

[Evaluation Criteria]
 A: 8.0 N/cm or greater
 B: 6.0 N/cm or greater but less than 8.0 N/cm
 C: less than 6.0 N/cm Examples 2 to 6, Comparative Examples 1 to 2

Anisotropic conductive films and bonded structures were each produced in the same manner as in Example 1, provided that a formulation of the crystalline resin, the amorphous resin, and the elastomer was changed as depicted in Table 1-1.

The obtained anisotropic conductive films and the bonded structures were each subjected to the evaluations in the same manner as in Example 1. The results are presented in Table 1-1.

Figure 1:
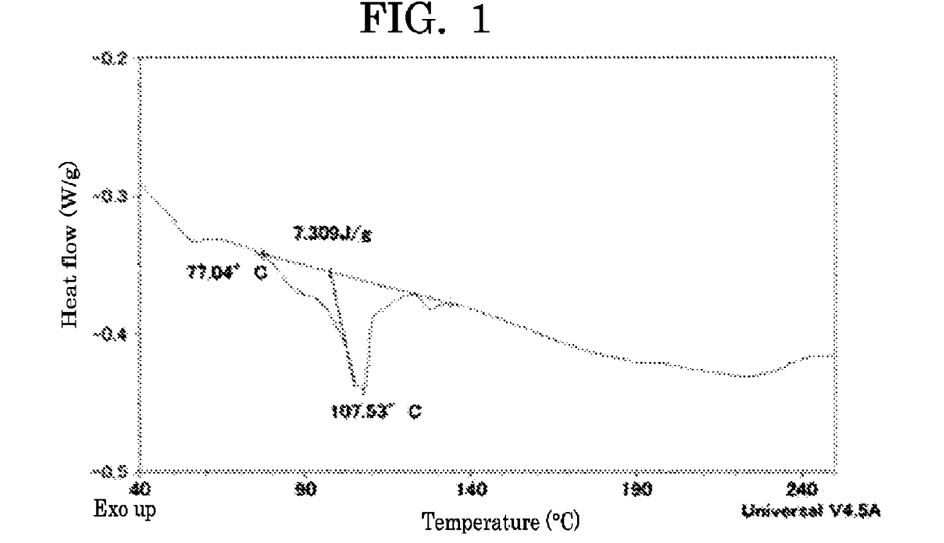
FIG. 1 is a DSC chart (at the time of heating) of the anisotropic conductive film obtained in Example 6.
Figure 2:
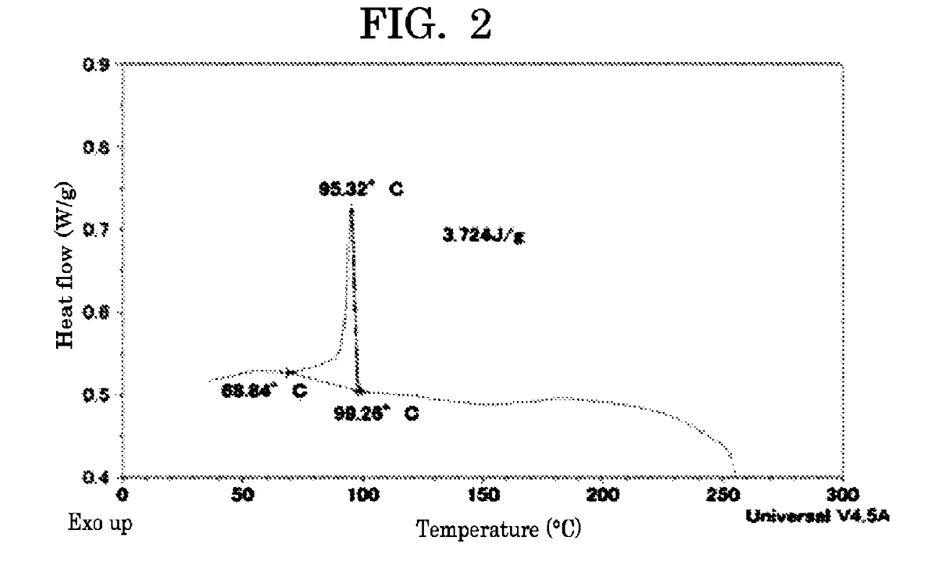
FIG. 2 is a DSC chart (at the time of cooling) of the anisotropic conductive film obtained in Example 6.

The DSC measurement results of the anisotropic conductive film obtained in Example 6 are depicted in FIGS. 1 and 2. FIG. 1 is a DSC chart at the time of heating. FIG. 2 is a DSC chart at the time of cooling. In the DSC chart of FIG. 1, the melt onset temperature was observed at 77.0° C., and the endothermic peak was observed at 107.5° C. Moreover, the endothermic value calculated from the endothermic peak area was 7.3 J/g. In the DSC chart of FIG. 2, the crystallization onset temperature was observed at 99.3° C., and the exothermic peak was observed at 95.3° C. Moreover, the exothermic value calculated from the exothermic peak area was 3.7 J/g.

Figure 3:
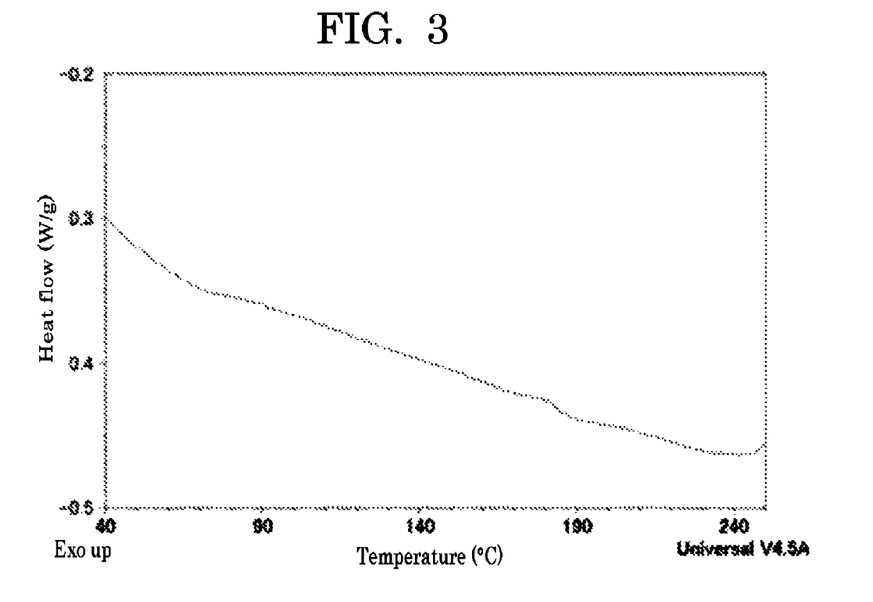
FIG. 3 is a DSC chart (at the time of heating) of the anisotropic conductive film obtained in Comparative Example 2.
Figure 4:
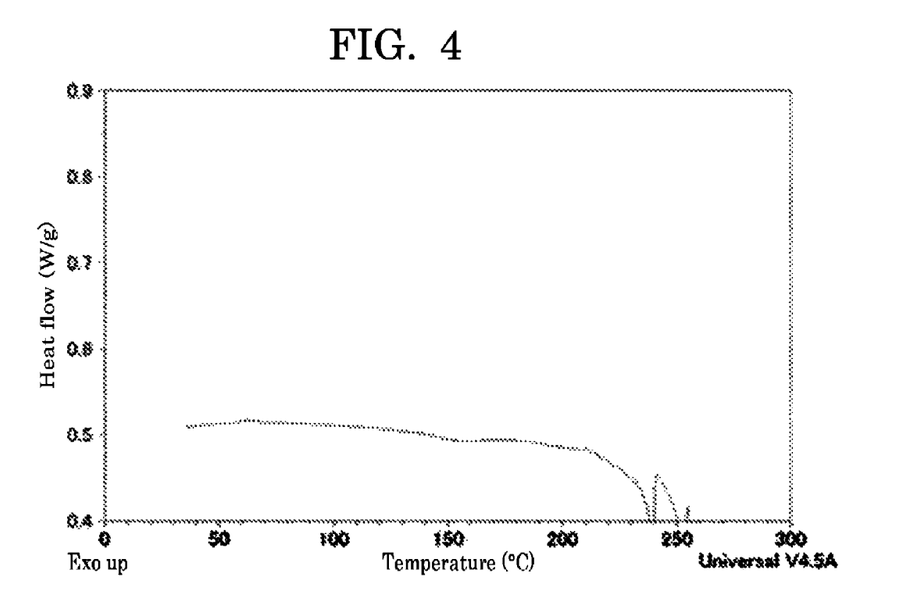
FIG. 4 is a DSC chart (at the time of cooling) of the anisotropic conductive film obtained in Comparative Example 2.

The DSC measurement results of the anisotropic conductive film obtained in Comparative Example 2 are depicted in FIGS. 3 and 4. FIG. 3 is a DSC chart at the time of heating. FIG. 4 is a DSC chart at the time of cooling. In the DSC chart of FIG. 3, an endothermic peak was not observed. In the DSC chart of FIG. 4, an exothermic peak was not observed.

Examples 7 to 10

Anisotropic conductive films and bonded structures were each produced in the same manner as in Example 1, provided that a formulation of the crystalline resin, the amorphous resin, and the elastomer was changed as depicted in Table 1-2.

The obtained anisotropic conductive films and the bonded structures were each subjected to the evaluations in the same manner as in Example 1. The results are presented in Table 1-2.

Example 11

An anisotropic conductive film and a bonded structure were produced in the same manner as in Example 5, provided that the crystalline resin was replaced with VYLON GA-6400 (manufactured by TOYOBO CO., LTD., a crystalline polyester resin), and the amorphous resin was replaced with ELITEL UE3600 (manufactured by UNITIKA LTD., an amorphous polyester resin).

The obtained anisotropic conductive film and bonded structure were evaluated in the same manner as in Example 1. The results are presented in Table 1-2.

Example 12

An anisotropic conductive film and a bonded structure were produced in the same manner as in Example 5, provided that the elastomer was replaced with TEISAN-RESIN SG-80H (manufactured by Nagase ChemteX Corporation, acrylic rubber-based elastomer).

The obtained anisotropic conductive film and bonded structure were evaluated in the same manner as in Example 1. The results are presented in Table 1-2.

Example 13

An anisotropic conductive film and a bonded structure were produced in the same manner as in Example 6, provided that the conductive particles were replaced with spherical Ag-plated resin particles having the average particle diameter of 10 μm.

The obtained anisotropic conductive film and bonded structure were evaluated in the same manner as in Example 1. The results are presented in Table 1-2.

Comparative Example 3

An anisotropic conductive film and a bonded structure were produced in the same manner as in Example 5, provided that the amorphous resin (the amorphous polyester resin) was replaced with YP-50 (manufactured by NIPPON STEEL & SUMIKIN CHEMICAL CO., LTD., an amorphous phenoxy resin).

The obtained anisotropic conductive film and bonded structure were evaluated in the same manner as in Example 1. The results are presented in Table 1-3.

Comparative Examples 4 to 5

Anisotropic conductive films and bonded structures were produced in the same manner as in Example 1, provided that the formulation of the crystalline resin, and the amorphous resin was changed as depicted in Table 1-3.

The obtained anisotropic conductive films and bonded structures were evaluated in the same manner as in Example 1. The results are presented in Table 1-3.

TABLE 1-1

|  |  |  |  | Example |  |  |  |  |  | Comparative Example |  |
|---|---|---|---|---|---|---|---|---|---|---|---|
|  |  |  |  | 1 | 2 | 3 | 4 | 5 | 6 | 1 | 2 |
| Crystalline resin | [PES-111EE] | (A) |  | 25 | 50 | 75 | 30 | 65 | 80 | 50 | — |
| Amorphous resin | [UE3500] | (B) |  | 75 | 50 | 25 | 30 | 65 | 80 | — | 50 |
| Elastomer | [N-5196] |  |  | 100 | 100 | 100 | 140 | 70 | 40 | 150 | 150 |
| Conductive particles |  |  |  | 7 | 7 | 7 | 7 | 7 | 7 | 7 | 7 |
| (A):(B) |  |  |  | 25:75 | 50:50 | 75:25 | 50:50 | 50:50 | 50:50 | — | — |
| DSC properties | Heating | Endothermic peak temperature (° C.) | (P1) | 108.0 | 108.2 | 108.2 | 108.0 | 107.7 | 107.5 | 108.1 | — |
|  |  | Melt onset temperature (° C.) |  | 83.2 | 80.0 | 83.2 | 85.0 | 79.8 | 77.0 | 81.6 | — |
|  |  | Endothermic value (J/g) |  | 1.4 | 3.9 | 6.1 | 2.0 | 5.0 | 7.3 | 3.3 | — |
|  | Cooling | Exothermic peak temperature (° C.) | (P2) | 95.7 | 95.3 | 95.7 | 95.3 | 95.7 | 95.3 | 95.4 | — |
|  |  | Crystallization onset temperature (° C.) |  | 99.3 | 99.3 | 99.8 | 99.0 | 99.8 | 99.3 | 99.3 | — |
|  |  | Exothermic value (J/g) |  | 1.1 | 2.3 | 3.4 | 1.3 | 2.8 | 3.7 | 2.1 | — |
|  | ΔT1 |  |  | 24.8 | 28.2 | 25.0 | 23.0 | 27.8 | 30.5 | 26.5 | — |
|  | ΔT2 |  |  | 3.5 | 4.0 | 4.1 | 3.7 | 4.1 | 3.9 | 3.8 | — |
|  | ΔT1 − ΔT2 |  |  | 21.3 | 24.2 | 20.9 | 19.4 | 23.7 | 26.6 | 22.7 | — |
|  | P1 − P2 |  |  | 12.3 | 12.9 | 12.5 | 12.7 | 12.0 | 12.2 | 12.7 | — |
| Pressure bonding properties | Initial | Conduction resistance (Ω) |  | A | A | A | A | A | A | B | A |
|  |  | Peeling strength (N/cm) |  | A | A | A | A | A | A | A | A |
|  | After high temp. high hum. test | Conduction resistance (Ω) |  | A | A | A | A | A | A | C | C |
|  |  | Peeling strength (N/cm) |  | A | A | A | A | A | A | A | A |

TABLE 1-2

|  |  |  |  | Example |  |  |  |  |  |  |
|---|---|---|---|---|---|---|---|---|---|---|
|  |  |  |  | 7 | 8 | 9 | 10 | 11 | 12 | 13 |
| Crystalline resin | [PES-111EE] | (A) |  | 100 | 20 | 15 | 85 | — | 65 | 80 |
|  | [GA-6400] |  |  | — | — | — | — | 65 | — | — |
| Amorphous resin | [UE3500] | (B) |  | 100 | 20 | 85 | 15 | — | 65 | 80 |
|  | [UE3600] |  |  | — | — | — | — | 65 | — | — |
| Elastomer | [N-5196] |  |  | — | 160 | 100 | 100 | 70 | — | 40 |
|  | [SG-80H] |  |  | — | — | — | — | — | 70 | — |
| Conductive particles |  |  |  | 7 | 7 | 7 | 7 | 7 | 7 | 7 |
| (A):(B) |  |  |  | 50:50 | 50:50 | 15:85 | 85:15 | 50:50 | 50:50 | 50:50 |
| DSC properties | Heating | Endothermic peak temperature (° C.) | (P1) | 107.5 | 108.0 | 107.5 | 108.0 | 73.9 | 107.5 | 107.6 |
|  |  | Melt onset temperature (° C.) |  | 79.2 | 83.8 | 82.6 | 81.4 | 59.4 | 63.5 | 78.1 |
|  |  | Endothermic value (J/g) |  | 11.0 | 1.6 | 1.0 | 7.6 | 0.7 | 8.7 | 7.2 |
|  | Cooling | Exothermic peak temperature (° C.) | (P2) | 95.8 | 95.9 | 95.6 | 95.4 | 61.2 | 96.0 | 94.9 |
|  |  | Crystallization onset temperature (° C.) |  | 100.4 | 99.5 | 98.7 | 99.8 | 68.3 | 99.8 | 99.0 |
|  |  | Exothermic value (J/g) |  | 5.8 | 1.1 | 0.7 | 4.7 | 0.1 | 3.7 | 3.5 |
|  | ΔT1 |  |  | 28.3 | 24.2 | 24.9 | 26.6 | 14.5 | 44.0 | 29.5 |
|  | ΔT2 |  |  | 4.6 | 3.6 | 3.1 | 4.4 | 7.1 | 3.8 | 4.1 |
|  | ΔT1 − ΔT2 |  |  | 23.7 | 20.6 | 21.8 | 22.2 | 7.4 | 40.2 | 25.4 |
|  | P1 − P2 |  |  | 11.7 | 12.1 | 11.9 | 12.6 | 12.7 | 11.5 | 12.7 |
| Pressure bonding properties | Initial | Conduction resistance (Ω) |  | A | A | A | A | A | A | A |
|  |  | Peeling strength (N/cm) |  | A | A | A | B | B | A | A |
|  | After high temp. high hum. test | Conduction resistance (Ω) |  | A | B | B | A | B | A | A |
|  |  | Peeling strength (N/cm) |  | A | A | A | A | A | A | A |

TABLE 1-3

|  |  |  |  | Comparative Example | | |
|---|---|---|---|---|---|---|
|  |  |  |  | 3 | 4 | 5 |
| Crystalline resin | [PES-111EE] | (A) |  | 65 | 100 | — |
| Amorphous resin | [UE3500] | (B) |  | — | — | 100 |
|  | [YP-50] |  |  | 65 | — | — |
| Elastomer | [N-5196] |  |  | 70 | 100 | 100 |
|  | Conductive particles |  |  | 7 | 7 | 7 |
|  | (A):(B) |  |  | — | — | — |
| DSC properties | Heating | Endothermic peak temperature (° C.) | (P1) | 106.8 | 107.7 | — |
|  |  | Melt onset temperature (° C.) |  | 83.8 | 80.8 | — |
|  |  | Endothermic value (J/g) |  | 5.3 | 9.5 | — |
|  | Cooling | Exothermic peak temperature (° C.) | (P2) | 95.8 | 95.7 | — |
|  |  | Crystallization onset temperature (° C.) |  | 99.8 | 99.8 | — |
|  |  | Exothermic value (J/g) |  | 2.6 | 4.2 | — |
|  | ΔT1 |  |  | 23.0 | 26.9 | — |
|  | ΔT2 |  |  | 4.0 | 4.1 | — |
|  | ΔT1 − ΔT2 |  |  | 19.0 | 22.8 | — |
|  | P1 − P2 |  |  | 11.0 | 12.0 | — |
| Pressure bonding properties | Initial | Conduction resistance (Ω) |  | B | B | A |
|  |  | Peeling strength (N/cm) |  | A | C | A |
|  | After high temp. high hum. test | Conduction resistance (Ω) |  | C | C | C |
|  |  | Peeling strength (N/cm) |  | A | A | A |

In Tables 1-1 to 1-3, a unit of the blended amount (the amount) of each component is parts by mass.

In Tables 1-1 to 1-3, ΔT1 is an absolute value of a difference between the melt onset temperature and the endothermic peak temperature at the time of heating as measured by differential scanning calorimetry, and ΔT2 is an absolute value of a difference between the crystallization onset temperature and the exothermic peak temperature at the time of cooling as measured by differential scanning calorimetry.

It was conformed from Examples 1 to 13 that the anisotropic conductive film of the present invention could achieve connection at low temperature (120° C.), and low pressure (2 MPa) within a short period (3 seconds), while maintaining sufficient connection resistance. Moreover, it was also confirmed that the bonded structure had excellent peeling strength.

It was confirmed from the results of Examples 1 to 3 and Examples 9 to 10 that the connection properties, i.e., the conduction resistance and the peeling strength, were excellent when the mass ratio (crystalline resin:amorphous resin) of the crystalline resin to the amorphous resin was 25:75 to 75:25.

It was confirmed from the results of Examples 4 to 6, and 8 that the excellent connection resistance was obtained even after the high temperature high humidity test, when the mass ratio (X:Y) of the sum (X) of the amount of the crystalline resin and the amount of the amorphous resin to the amount (Y) of the elastomer was 160:40 to 60:140.

Since the anisotropic conductive film of Comparative Example 1 did not contain an amorphous resin, a smooth anisotropic conductive film could not be attained. As a result, the conduction resistance after the high temperature high humidity test was insufficient.

Since the anisotropic conductive films of Comparative Examples 2 and 5 did not contain a crystalline resin, a cohesive force of each anisotropic conductive film was weak. As a result, the conduction resistance after the high temperature high humidity test was insufficient.

Since the type of the crystalline resin was different from the type of the amorphous resin (contains the different bond characterizing a resin) in the anisotropic conductive film of Comparative Example 3, a smooth anisotropic conductive film could not be obtained. As a result, the conduction resistance after the high temperature high humidity test was insufficient.

Since the anisotropic conductive film of Comparative Example 4 did not contain an amorphous resin, a smooth anisotropic conductive film could not be obtained. As a result, the conduction resistance after the high temperature high humidity test was insufficient. Since the amount of the crystalline resin was large, and the crystalline resin was not homogeneously dispersed in the elastomer, moreover, the anisotropic conductive film partially had hard areas. Therefore, the peeling strength of the resulting bonded structure was insufficient.

INDUSTRIAL APPLICABILITY

The anisotropic conductive film of the present invention can realize connection at low temperature and low pressure within a short period, while maintaining sufficient connection resistance. Therefore, the anisotropic conductive film is suitably used as a connecting material when a bonded structure is produced by anisotropic conductively connecting a terminal of a substrate and a terminal of an electronic part.

The invention claimed is:

1. An anisotropic conductive film, comprising:
   a crystalline resin;
   an amorphous resin; and
   conductive particles,
   wherein the anisotropic conductive film is an anisotropic conductive film configured to anisotropic conductively connect a terminal of a first electronic part and a terminal of a second electronic part,
   wherein the crystalline resin contains a crystalline resin containing a bond characterizing a resin, which is identical to a bond characterizing a resin contained in the amorphous resin, and
   wherein the anisotropic conductive film is an anisotropic conductive film which shows an endothermic peak at a time of heating and an exothermic peak at a time of cooling when measured by differential scanning calorimetry.

2. The anisotropic conductive film according to claim 1, wherein the anisotropic conductive film satisfies the following formula:

$$\Delta T1 > \Delta T2$$

where ΔT1 is an absolute value of a difference between melting onset temperature and endothermic peak temperature at the time of heating, and ΔT2 is an absolute value of a difference between crystallization onset temperature and exothermic peak temperature at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

3. The anisotropic conductive film according to claim 1, wherein a mass ratio (crystalline resin:amorphous resin) of the crystalline resin to the amorphous resin is 25:75 to 75:25.

4. The anisotropic conductive film according to claim 1, wherein the crystalline resin contains a crystalline polyester resin, and the amorphous resin contains an amorphous polyester resin.

5. The anisotropic conductive film according to claim 1, further comprising an elastomer.

6. The anisotropic conductive film according to claim 5, wherein a mass ratio (X:Y) of a sum (X) of an amount of the crystalline resin and an amount of the amorphous resin to an amount (Y) of the elastomer is 160:40 to 60:140.

7. The anisotropic conductive film according to claim 1, wherein the conductive particles have an average particle diameter of 2 μm to 40 μm.

8. The anisotropic conductive film according to claim 1, wherein the anisotropic conductive film satisfies a relationship that a difference (P1−P2) is 11.0° C. or greater, where P1 is the endothermic peak temperature at the time of heating, and P2 is the exothermic peak temperature at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

9. The anisotropic conductive film according to claim 1, wherein the anisotropic conductive film gives an endothermic value of 1.0 J/g to 12 J/g at the time of heating, and an exothermic value of 1.0 J/g to 6.0 J/g at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

10. A connecting method, comprising:
arranging an anisotropic conductive film on a terminal of a second electronic part;
arranging a first electronic part on the anisotropic conductive film in a manner that a terminal of the first electronic part is in contact with the anisotropic conductive film; and
heating and pressing the first electronic part with a heat-press member, to thereby anisotropic conductively connect the terminal of the first electronic part to the terminal of the second electronic part,
wherein the anisotropic conductive film contains:
a crystalline resin;
an amorphous resin; and
conductive particles,
wherein the crystalline resin contains a crystalline resin containing a bond characterizing a resin, which is identical to a bond characterizing a resin contained in the amorphous resin, and
wherein the anisotropic conductive film is an anisotropic conductive film which shows an endothermic peak at a time of heating and an exothermic peak at a time of cooling when measured by differential scanning calorimetry.

11. A bonded structure, comprising:
a first electronic part containing a terminal;
a second electronic part containing a terminal; and
an anisotropic conductive film, which is present between the first electronic part and the second electronic part, and is configured to electrically connect the terminal of the first electronic part and the terminal of the second electronic part,
wherein the anisotropic conductive film contains:
a crystalline resin;
an amorphous resin; and
conductive particles,
wherein the crystalline resin contains a crystalline resin containing a bond characterizing a resin, which is identical to a bond characterizing a resin contained in the amorphous resin, and
wherein the anisotropic conductive film is an anisotropic conductive film which shows an endothermic peak at a time of heating and an exothermic peak at a time of cooling when measured by differential scanning calorimetry.

12. The connecting method according to claim 10, wherein the anisotropic conductive film satisfies the following formula:

$$\Delta T1 > \Delta T2$$

where ΔT1 is an absolute value of a difference between melting onset temperature and endothermic peak temperature at the time of heating, and ΔT2 is an absolute value of a difference between crystallization onset temperature and exothermic peak temperature at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

13. The connecting method according to claim 10, wherein a mass ratio (crystalline resin:amorphous resin) of the crystalline resin to the amorphous resin is 25:75 to 75:25.

14. The connecting method according to claim 10, wherein the crystalline resin contains a crystalline polyester resin, and the amorphous resin contains an amorphous polyester resin.

15. The connecting method according to claim 10, wherein the anisotropic conductive film satisfies a relationship that a difference (P1−P2) is 11.0° C. or greater, where P1 is the endothermic peak temperature at the time of heating, and P2 is the exothermic peak temperature at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

16. The bonded structure according to 11, wherein the anisotropic conductive film satisfies the following formula:

$$\Delta T1 > \Delta T2$$

where ΔT1 is an absolute value of a difference between melting onset temperature and endothermic peak temperature at the time of heating, and ΔT2 is an absolute value of a difference between crystallization onset temperature and exothermic peak temperature at the time of cooling, as the anisotropic conductive film is measured by differential scanning calorimetry with the following measuring temperature range, the following heating speed, and the following cooling speed:

Measuring temperature range: 30° C. to 250° C.;
Heating speed: 10° C./min; and
Cooling speed: 20° C./min.

17. The bonded structure according to claim 11, wherein a mass ratio (crystalline resin:amorphous resin) of the crystalline resin to the amorphous resin is 25:75 to 75:25.

18. The bonded structure according to claim 11, wherein the crystalline resin contains a crystalline polyester resin, and the amorphous resin contains an amorphous polyester resin.

19. The bonded structure according to claim 11, wherein the anisotropic conductive film satisfies a relationship that a difference (P1−P2) is 11.0° C. or greater, where P1 is the endothermic peak temperature at the time of heating, and P2 is the exothermic peak temperature at the time of cooling, as the anisotropic conductive film is measured by differential scanning calorimetry with the following measuring temperature range, the following heating speed, and the following cooling speed:
Measuring temperature range: 30° C. to 250° C.;
Heating speed: 10° C./min; and
Cooling speed: 20° C./min.

* * * * *